United States Patent
Cui

(10) Patent No.: US 10,833,136 B2
(45) Date of Patent: Nov. 10, 2020

(54) PIXEL DEFINING LAYER WITH CONCAVE WALL PORTION, DISPLAY PANEL AND DISPLAY DEVICE

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/151,621

(22) Filed: Oct. 4, 2018

(65) Prior Publication Data

US 2019/0221621 A1    Jul. 18, 2019

(30) Foreign Application Priority Data

Jan. 12, 2018    (CN) .......................... 2018 1 0031622

(51) Int. Cl.
| | |
|---|---|
| H01L 29/08 | (2006.01) |
| H01L 27/32 | (2006.01) |
| H01L 51/52 | (2006.01) |
| H01L 51/50 | (2006.01) |

(52) U.S. Cl.
CPC ...... *H01L 27/3246* (2013.01); *H01L 51/5012* (2013.01); *H01L 51/5206* (2013.01); *H01L 51/5221* (2013.01)

(58) Field of Classification Search
CPC .......................... H01L 51/5012; H01L 27/3246
USPC .......................................................... 257/40
See application file for complete search history.

(56) References Cited

U.S. PATENT DOCUMENTS

| 2007/0196960 | A1  | 8/2007  | Kasahara et al. |
| 2007/0236425 | A1* | 10/2007 | Furuie ............... H01L 51/5275 345/77 |
| 2013/0301112 | A1* | 11/2013 | Nakamura .......... G02F 1/167 359/296 |
| 2014/0346484 | A1* | 11/2014 | Nendai ............... H01L 51/5228 257/40 |
| 2016/0172423 | A1* | 6/2016  | Nendai ............... H01L 27/3246 257/40 |
| 2017/0012246 | A1* | 1/2017  | Onimaru ............. H01L 27/3246 |
| 2017/0040393 | A1* | 2/2017  | Onimaru ............. H01L 27/3246 |
| 2017/0170244 | A1* | 6/2017  | Kobayashi .......... H01L 27/3283 |
| 2018/0190736 | A1* | 7/2018  | Kim .................... H01L 27/3213 |

FOREIGN PATENT DOCUMENTS

| CN | 104241329 A | 12/2014 |
| CN | 104393192   | 3/2015  |
| CN | 104779268   | 7/2015  |

(Continued)

OTHER PUBLICATIONS

First Office Action for CN Application No. 201810031622.9, dated Jan. 16, 2020, 17 pages.

*Primary Examiner* — Caleb E Henry
(74) *Attorney, Agent, or Firm* — Dinsmore & Shohl LLP

(57) ABSTRACT

This disclosure provides a pixel defining layer, a display panel and a display device. The pixel defining layer comprises a pixel partition wall, wherein the pixel partition wall encloses a plurality of openings; wherein the pixel partition wall comprises a first layer, wherein the first layer is disposed on a base substrate, and wherein a sidewall of the first layer has a concave wall portion concave inward towards the pixel partition wall.

14 Claims, 2 Drawing Sheets

(56) References Cited

FOREIGN PATENT DOCUMENTS

| | | |
|---|---|---|
| CN | 104779269 | 7/2015 |
| CN | 105529353 | 4/2016 |
| CN | 107403811 | 11/2017 |
| KR | 20160121800 | 10/2016 |

* cited by examiner

PIXEL DEFINING LAYER WITH CONCAVE WALL PORTION, DISPLAY PANEL AND DISPLAY DEVICE

CROSS-REFERENCE TO RELATED APPLICATIONS

This application claims the benefit of priority to the Chinese Patent Application No. 201810031622.9, filed on Jan. 12, 2018, which is hereby incorporated by reference in its entirety into this application for all purposes.

TECHNICAL FIELD

This disclosure relates to a pixel defining layer, a display panel and a display device.

BACKGROUND

Among OLED (Organic Light-Emitting Diode) display technologies, the inkjet printing color patterning technology has gradually become a mainstream technology in the OLED manufacturing field due to its advantages such as simple operation, low cost, simple process and easy implementation of large size.

At present, when forming a film in a pixel region defined by a pixel defining layer through the inkjet printing technology, in the process of ink drying and film forming, a climbing phenomenon will occur on the edges of the pixel, as a result, the formed film is thin in the middle but too thick on the edges, such that film formation inside the pixel is uneven.

SUMMARY

In an aspect, at least one embodiment of this disclosure provides a pixel defining layer comprising a pixel partition wall, wherein the pixel partition wall encloses a plurality of openings; wherein the pixel partition wall comprises a first layer, wherein the first layer is disposed on a base substrate, and wherein a sidewall of the first layer has a concave wall portion concave inward towards the pixel partition wall.

In an example, an orthographical projection of the opening on the base substrate is substantially circular.

In an example, the first layer is made of a hydrophilic material.

In an example, the concave wall portion extends from a bottom surface of the first layer to a top surface of the first layer opposite to the bottom surface, in a direction away from the base substrate.

In an example, a cross section of the concave wall portion on a plane perpendicular to a plane where the base substrate is in is of a circular arc shape.

In an example, the concave wall portion comprises a first edge connected with the top surface and a second edge connected with the bottom surface, and an orthographical projection of the first edge on the base substrate is less than or equal to an orthographical projection of the second edge on the base substrate.

In an example, the pixel partition wall further comprises a second layer, wherein the second layer is disposed on a side of the first layer away from the base substrate, and wherein the second layer is made of a hydrophobic material.

In an example, the first layer is made of an inorganic hydrophilic material, and the second layer is made of an organic hydrophobic material.

In an example, the hydrophilic material is at least one of silica and silicon nitride.

In an example, the hydrophobic material is polyimide.

In another aspect, at least one embodiment of this disclosure further provides a display panel comprising a base substrate, and the aforementioned pixel defining layer, wherein the first layer of the pixel defining layer is disposed on the base substrate.

In an example, an orthographical projection of the opening on the base substrate is substantially circular.

In an example, an anode layer, a light-emitting layer and a cathode layer are arranged in this order on the base substrate, in a direction away from the base substrate, wherein the light-emitting layer is disposed in a space enclosed by the first layer, wherein the cathode layer is disposed on the light-emitting layer, and wherein an orthographical projection of a portion of the cathode layer in contact with the light-emitting layer on the base substrate is less than an orthographical projection of the light-emitting layer on the base substrate.

In still another aspect, at least one embodiment of this disclosure further provides a display device comprising: the aforementioned display panel.

In an example, an orthographical projection of the opening on the base substrate is substantially circular.

In an example, an anode layer, a light-emitting layer and a cathode layer are arranged in this order on the base substrate, in a direction away from the base substrate, wherein the light-emitting layer is disposed in a space enclosed by the first layer, wherein the cathode layer is disposed on the light-emitting layer, and wherein an orthographical projection of a portion of the cathode layer in contact with the light-emitting layer on the base substrate is less than an orthographical projection of the light-emitting layer on the base substrate.

DETAILED DESCRIPTION

At least one embodiment of this disclosure provides a pixel defining layer, a display panel and a display device, which improves the uniformity of film formation in a pixel region defined by the pixel defining layer.

This disclosure will be further described in detail in the following in combination with the accompanying drawings and the at least one embodiment.

Figure 1:
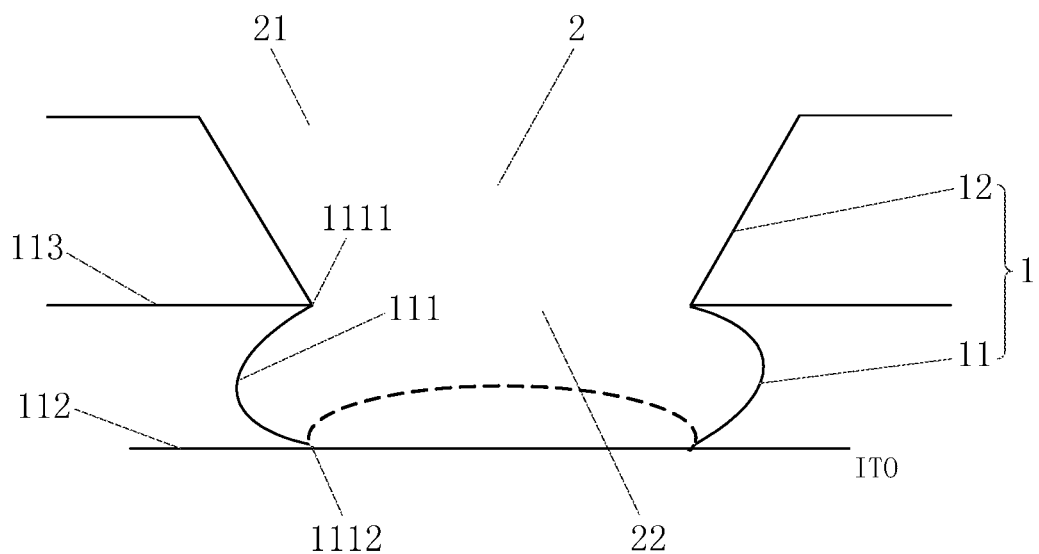
FIG. 1 is a schematic diagram showing a structure of a pixel defining layer according to at least one embodiment of this disclosure.

As shown in FIG. 1, at least one embodiment of this disclosure provides a pixel defining layer comprising a pixel partition wall 1, wherein the pixel partition wall 1 encloses a plurality of openings 2; the pixel partition wall 1 comprises a first layer 11, wherein the first layer 11 is disposed on a base substrate, and a sidewall of the first layer 11 has a concave wall portion 111 concave inward towards the pixel partition wall 1.

Figure 3:
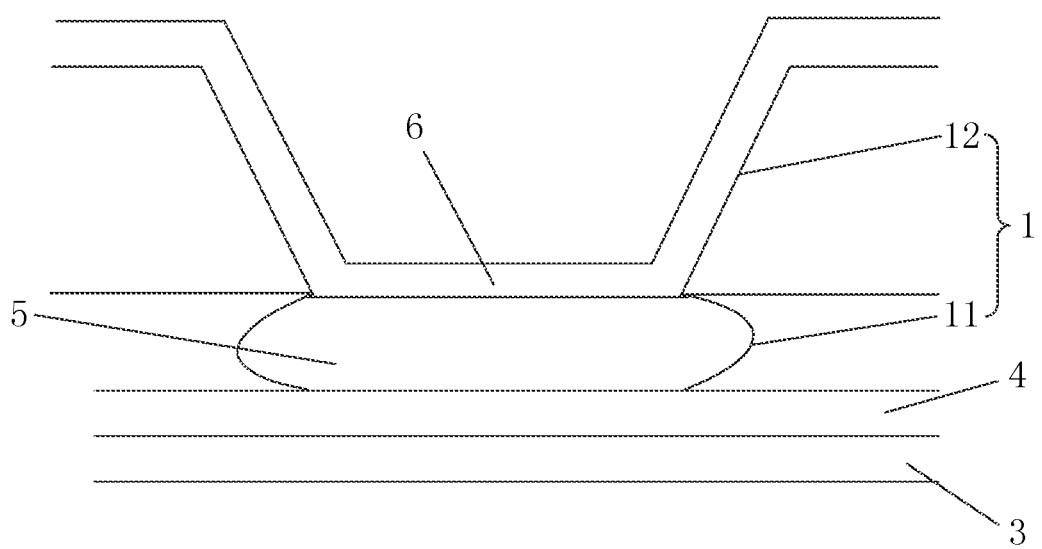
FIG. 3 is a schematic diagram showing a structure of a display panel according to at least one embodiment of this disclosure.

See FIG. 3, in the OLED display panel, an ITO (Indium Tin Oxide) film is usually fabricated on a base substrate 3 as an anode layer 4, then a pixel defining layer is fabricated to define a pixel region, and an organic functional layer, i.e., a light-emitting layer 5, is fabricated through the inkjet printing technology in the pixel region, wherein the organic functional layer adjoins the anode layer 4, and a cathode layer 6 is evaporated on the organic functional layer such that the organic functional layer can emit light.

A plurality of openings 2 enclosed by the pixel partition wall 1 are pixel regions defined by the pixel defined layer, and the openings 2 comprise upper openings 21 and lower openings 22, wherein the upper opening 21 runs through the lower opening 22 to communicate therewith. The sidewall of the first layer 11 has a concave wall portion 111, and the concave wall portion 111 is concave inward towards the pixel partition wall 1. That is to say, a wall of the pixel partition wall 1 adjoining an edge of the pixel region is provided with a circle of groove structure. In the process of ink drying and film forming, the ink climbs along the concave wall portion 111, and the sidewall portion in the concave wall portion 111 extending upward from a bottom surface of the groove can block the ink climbing, thereby improving the uniformity of film formation.

In the pixel defining layer according to at least one embodiment of this disclosure, the pixel partition wall encloses a plurality of openings to define the pixel region, and the sidewall of the first layer of the pixel partition wall is provided with the concave wall portion concave inward towards the pixel partition wall; when forming a film in the pixel region defined by the pixel defining layer through the inkjet printing technology, in the process of ink drying and film forming, the ink climbs along the concave wall portion, and the concave wall portion blocks the ink climbing. As compared with the use of a flat and straight sidewall, the pixel defining layer according to at least one embodiment of this disclosure uses the sidewall with the concave wall portion, which increases the resistance of ink climbing, effectively reduces the phenomenon that the film is thin in the middle and too thick on the edge, and improves the uniformity of film formation.

Figure 2:
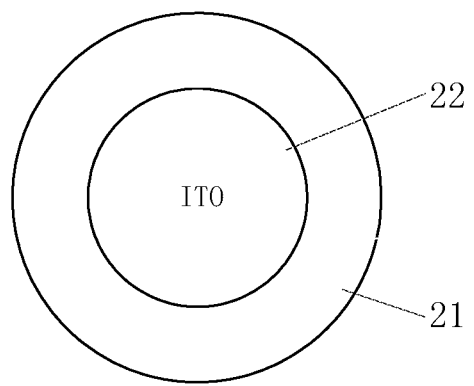
FIG. 2 is a top view of the pixel defining layer of FIG. 1.

In an example, see FIG. 2, an orthographical projection of the opening 2 on the base substrate is substantially circular. Viewed downwards from the upper opening 21 to the lower opening 22 of the opening 2, the shape is substantially circular, that is, the pixel region defined by the pixel defining layer is substantially circular, then a length from the middle to the edge of the pixel is the same, so that the climbing of the ink on the substantially circular edge of the pixel is the same; as compared with the problem that in a quadrilateral pixel region defined by the pixel defining layer, the ink climbs differently on the various edges around the pixel, the pixel defining layer according to at least one embodiment of this disclosure effectively solves the problem, and thereby improves the uniformity of film formation in the pixel region.

In an example, see FIG. 1, the first layer 11 is made of a hydrophilic material, then the first layer 11 has a hydrophilic property, so that the ink tends to be on the sidewall of the first layer 11 on the pixel edge, which suppresses the ink from climbing upwards.

In an example, see FIG. 1 and FIG. 3, in a direction away from the base substrate 3, the concave wall portion 111 extends from a bottom surface 112 of the first layer 11 to a top surface 113 of the first layer 11 opposite to the bottom surface 112. In other words, the first layer 11 comprises opposite bottom surface 112 and top surface 113, and usually the bottom surface 112 is in contact with the anode layer 4, and the concave wall portion 111 extends from the bottom surface 112 to the top surface 113; in the process of ink drying and film forming, the ink climbs to the concave wall portion 111, and the concave wall portion 111 extends to the top surface 113, to achieve the maximization of the concave wall portion 111, so as to ensure that the concave wall portion 111 can sufficiently block the ink climbing to improve the uniformity of film formation. When the first layer 11 is made of the hydrophilic material, the hydrophilic material can inhibit the ink from climbing upwards, so after the ink is dried and forms a film, an edge of the film surface intersecting the pixel partition wall is located in the first layer 11, so that the film surface intersects the concave wall portion 111, to ensure that the concave wall portion 111 always blocks the ink climbing, which further improves the uniformity of film formation.

In an example, see FIG. 1 and FIG. 3, a cross section of the concave wall portion 111 in a plane perpendicular to a plane where the base substrate 3 is in is of a circular arc shape. The concave wall portion 111 can be made by an etching method of wet etching, and the shape made by this method is of a circular arc shape; the making is convenient, and the circular arc concave wall portion 111 causes the climbing upwards of the ink more difficult.

In an example, see FIG. 1 and FIG. 3, the concave wall portion 111 comprises a first edge 1111 connected with the top surface 113, and a second edge 1112 connected with the bottom surface 112, and an orthographical projection of the first edge 1111 on the bae substrate 3 is less than or equal to an orthographical projection of the second edge 1112 on the base substrate 3. That is to say, from the top surface 113 to the bottom surface 112 of the first layer 11, orthographical projections of the first edge 1111 and the second edge 1112 of the concave wall portion 111 on the base substrate 3 coincide with each other, or the orthographical projection of the first edge 1111 on the base substrate 3 is located in the orthographical projection of the second edge 1112 on the base substrate 3; the design is such that, in the evaporation of the cathode, the cathode is not evaporated on the film of the light-emitting layer 5 in the concave wall portion 111, therefore, the film of the light-emitting layer 5 in the concave wall portion 111 will not emit light, which avoids uneven luminescence due to uneven film formation in the concave wall portion 111 after ink drying and film forming, further improves the uniformity of effective film formation in the pixel, and guarantees the uniformity of luminescence.

In an example, see FIG. 1 and FIG. 3, the pixel partition wall 1 further comprises a second layer 12, wherein the second layer 12 is disposed on a side of the first layer 11 away from the base substrate 3, and the second layer 12 is made of a hydrophobic material. The first layer 11 can be in contact with the anode layer 4, then the first layer 11 is a lower layer, and the second layer 12 is an upper layer; the second layer 12 uses the hydrophobic material and has a hydrophobic property, which can effectively suppress the ink from climbing upwards, and prevent the ink from overflowing to a top surface of the second layer 12, to guarantee that the ink smoothly enters the first layer 11.

In an example, see FIG. 1, the first layer 11 is made of an inorganic hydrophilic material, and the second layer 12 is made of an organic hydrophobic material. Under normal circumstances, an inorganic hydrophilic material is selected for the hydrophilic material, and an organic hydrophobic material is selected for the hydrophobic material, such selections make the process easier to implement when fabricating the first layer 11 and the second layer 12 of the pixel partition wall 1 respectively. It should be further noted that, the concave wall portion 111 can be achieved through the etching process, and specifically, the etching time can be increased to perform over-etching, and those skilled in the art could appropriately adjust etching process parameters, as long as the structure of the concave wall portion 111 can be etched.

In an example, the hydrophilic material is at least one of silica and silicon nitride. Among them, the hydrophilic silica has a higher melting point and boiling point, has excellent electrical insulating property and processing feasibility, and relatively stable chemical property; the hydrophilic silicon nitride has a high strength, endures high temperature, still can maintain a higher strength under high temperature, has a good chemical corrosion resistance, and is a high-performance electrical insulating material.

In an example, the hydrophobic material is polyimide. The hydrophobic polyimide has excellent physical properties, electrical insulating properties, flame-retardant properties, mechanical properties, etc. It endures high temperature, and has a high toughness.

The above selections of hydrophilic materials and hydrophobic materials are suitable choices by taking into considerations hydrophilic or hydrophobic properties, physical and chemical properties and the degree to which the process can be easily realized.

In the pixel defining layer according to at least one embodiment of this disclosure, the pixel partition wall encloses a plurality of openings to define the pixel region, and the sidewall of the first layer of the pixel partition wall is provided with the concave wall portion concave inward towards the pixel partition wall; when forming a film in the pixel region defined by the pixel defining layer through the inkjet printing technology, in the process of ink drying and film forming, the ink climbs along the concave wall portion, and the concave wall portion blocks the ink climbing. As compared with the use of a flat and straight sidewall, the pixel defining layer according to at least one embodiment of this disclosure uses the sidewall with the concave wall portion, which increases the resistance of ink climbing, effectively reduces the phenomenon that the film is thin in the middle and too thick on the edge, and improves the uniformity of film formation. Moreover, by designing the pixel partition wall as the first and second layers from bottom to top, wherein the first layer uses a hydrophilic material, and the second layer uses a hydrophobic material, climbing upwards of the ink can be suppressed, and the first layer is provided with the concave wall portion, which can block the ink climbing, and effectively avoid uneven luminescence of film formation in the concave wall portion, and which further improves the uniformity of effective film formation in pixel region.

As shown in FIG. 3, at least one embodiment of this disclosure provides a display panel comprising the base substrate 3, and the aforementioned pixel-defining layer, wherein the first layer 11 of the pixel defining layer is disposed on the base substrate 3.

The structure and operating principle of the pixel defining layer are the same as those in at least one embodiment described above and thus are omitted herein.

In an example, see FIG. 1 and FIG. 3, the anode layer 4, the light-emitting layer 5 and the cathode layer 6 are arranged in this order on the base substrate 3, in a direction away from the base substrate 3, wherein the light-emitting layer 5 is disposed in a space enclosed by the first layer 11, the cathode layer 6 is disposed on the light-emitting layer 5, and an orthographical projection of a portion of the cathode layer 6 in contact with the light-emitting layer 5 on the base substrate 3 is less than an orthographical projection of the light-emitting layer 5 on the base substrate 3. The anode layer 4 is fabricated on the base substrate 3, wherein the anode layer 4 usually adopts an ITO (Indium Tin Oxide) film, then the pixel defining layer is fabricated on the anode layer 4 to define the pixel region, and the light-emitting layer 5 is fabricated through the inkjet printing technology in the pixel region such that the light-emitting layer 5 is entirely within the space enclosed by the first layer 11, then the cathode layer 6 is evaporated on the light-emitting layer 5 such that the orthographical projection of the portion of the cathode layer 6 in contact with the light-emitting layer 5 on the base substrate 3 is less than the orthographical projection of the light-emitting layer 5 on the base substrate 3; in this way, the cathode layer 6 is disposed above the concave wall portion 111 to guarantee that the cathode isn't evaporated on the film in the concave wall portion 111, therefore, the film in the concave wall portion 111 will not emit light, which avoids uneven luminescence due to uneven film formation in the concave wall portion 111 after ink drying and film forming, further improves the uniformity of effective film formation in the pixel, and guarantees the uniformity of luminescence.

In the display panel according to at least one embodiment of this disclosure, the pixel partition wall encloses a plurality of openings to define the pixel region, and the sidewall of the first layer of the pixel partition wall is provided with the concave wall portion concave inward towards the pixel partition wall; when forming a film in the pixel region defined by the pixel defining layer through the inkjet printing technology, in the process of ink drying and film forming, the ink climbs along the concave wall portion, and the concave wall portion blocks the ink climbing. As compared with the use of a flat and straight sidewall, the pixel defining layer according to at least one embodiment of this disclosure uses the sidewall with the concave wall portion, which increases the resistance of ink climbing, effectively reduces the phenomenon that the film is thin in the middle and too thick on the edge, and improves the uniformity of film formation.

At least one embodiment of this disclosure provides a display device comprising: the aforementioned display panel.

The structure and operating principle of the display panel are the same as those in at least one embodiment described above and thus are omitted herein.

In the display device according to at least one embodiment of this disclosure, the pixel region defined by the pixel defining layer in the display panel is substantially circular, such that a length from the middle to the edge of the pixel is the same; when forming a film in the pixel region defined by the pixel defining layer through the inkjet printing technology, in the process of ink drying and film forming, the climbing of the ink on the substantially circular edge of the pixel is the same; as compared with the different case of ink climbing, the pixel defining layer according to at least one embodiment of this disclosure improves the uniformity of film formation in the pixel region defined by the pixel defining layer.

Only specific embodiments of this disclosure are described above, but the scope of protection of this disclosure is not restricted thereto, and persons of ordinary skills in the art could readily conceive of various variations or substitutions within the technical scope revealed by this disclosure, and all these variations or substitutions shall be within the scope of protection of this disclosure. Therefore, the scope of protection of this disclosure shall be determined by the scope of protection of the claims.

What is claimed is:

1. A display panel comprising:
a base substrate; and
a pixel defining layer and a light-emitting layer, wherein the pixel defining layer comprises:
   a plurality of pixel partition walls, wherein two adjacent pixel partition walls of the plurality of pixel partition walls enclose an opening therebetween which defines a pixel region;
   wherein each of the pixel partition walls comprises a first layer, wherein the first layer is disposed on a base substrate, and a sidewall of the first layer has a concave wall portion which is in direct contact with a light-emitting layer, the concave wall portion concave inward towards the pixel partition wall, wherein the first layer of the pixel defining layer is disposed on the base substrate.

2. The display panel according to claim 1, wherein the first layer is made of a hydrophilic material.

3. The display panel according to claim 2, wherein the hydrophilic material is at least one of silica and silicon nitride.

4. The display panel according to claim 1, wherein the concave wall portion extends from a bottom surface of the first layer to a top surface of the first layer opposite to the bottom surface, in a direction away from the base substrate.

5. The display panel according to claim 4, wherein the concave wall portion comprises a first edge connected with the top surface and a second edge connected with the bottom surface, and wherein an orthographical projection of the first edge on the base substrate is less than or equal to an orthographical projection of the second edge on the base substrate.

6. The display panel according to claim 1, wherein a cross section of the concave wall portion on a plane perpendicular to a plane where the base substrate is in is of a circular arc shape.

7. The display panel according to claim 1, wherein the pixel partition wall further comprises a second layer, wherein the second layer is disposed on a side of the first layer away from the base substrate, and wherein the second layer is made of a hydrophobic material.

8. The display panel according to claim 7, wherein the first layer is made of an inorganic hydrophilic material, and the second layer is made of an organic hydrophobic material.

9. The display panel according to claim 7, wherein the hydrophobic material is polyimide.

10. The display panel according to claim 1, wherein an orthographical projection of the opening on the base substrate is substantially circular.

11. The display panel according to claim 1, wherein an anode layer, the light-emitting layer and a cathode layer are arranged in this order on the base substrate, in a direction away from the base substrate, wherein the light-emitting layer is disposed in a space enclosed by the first layer, wherein the cathode layer is disposed on the light-emitting layer, and wherein an orthographical projection of a portion of the cathode layer in contact with the light-emitting layer on the base substrate is less than an orthographical projection of the light-emitting layer on the base substrate.

12. A display device comprising: the display panel according to claim 1.

13. The display device according to claim 12, wherein an orthographical projection of the opening on the base substrate is substantially circular.

14. The display device according to claim 12, wherein an anode layer, a light-emitting layer and a cathode layer are arranged in this order on the base substrate, in a direction away from the base substrate wherein the light-emitting layer is disposed in a space enclosed by the first layer, wherein the cathode layer is disposed on the light-emitting layer, and wherein an orthographical projection of a portion of the cathode layer in contact with the light-emitting layer on the base substrate is less than an orthographical projection of the light-emitting layer on the base substrate.

* * * * *